(12) United States Patent
Duarte et al.

(10) Patent No.: US 7,646,612 B2
(45) Date of Patent: Jan. 12, 2010

(54) ELECTRONIC ASSEMBLY WITH A HEAT SINK IN PARTICULAR FOR A DISCHARGE LAMP CONTROL MODULE FOR MOTOR VEHICLE HEADLIGHTS

(75) Inventors: Marc Duarte, Bobigny Cedex (FR); Jean-Marc Nicolai, Bobigny Cedex (FR); David Myotte, Bobigny Cedex (FR); Fabrice Govin, Bobigny Cedex (FR)

(73) Assignee: Valeo Vision, Bobigny Cedex (FR)

( * ) Notice: Subject to any disclaimer, the term of this patent is extended or adjusted under 35 U.S.C. 154(b) by 402 days.

(21) Appl. No.: 11/178,156

(22) Filed: Jul. 8, 2005

(65) Prior Publication Data
US 2006/0098416 A1 May 11, 2006

(30) Foreign Application Priority Data
Jul. 9, 2004 (FR) .................................. 04 07725

(51) Int. Cl.
*H05K 7/14* (2006.01)
*H05K 7/18* (2006.01)

(52) U.S. Cl. ........................ 361/799; 351/784; 351/807
(58) Field of Classification Search ................ 361/799, 361/600, 784, 679, 760, 748, 772, 774; 439/61, 439/59, 55, 78
See application file for complete search history.

(56) References Cited
U.S. PATENT DOCUMENTS
3,729,819 A * 5/1973 Hone .......................... 174/259

| | | | | |
|---|---|---|---|---|
| 5,552,961 A * | 9/1996 | Van Gaal et al. ............. 361/700 |
| 5,949,137 A * | 9/1999 | Domadia et al. ............. 257/712 |
| 6,084,776 A | 7/2000 | Cuntz et al. |
| 6,347,038 B1 | 2/2002 | Duarte et al. |
| 6,696,643 B2 * | 2/2004 | Takano ........................ 174/520 |
| 6,765,793 B2 * | 7/2004 | Kehret et al. ................. 361/690 |
| 6,816,377 B2 * | 11/2004 | Itabashi et al. ............... 361/704 |
| 7,068,510 B2 * | 6/2006 | Crippen et al. ............... 361/702 |
| 7,071,420 B2 * | 7/2006 | Chambers .................... 174/255 |
| 7,177,153 B2 * | 2/2007 | Radosevich et al. ......... 361/699 |
| 2002/0141150 A1 | 10/2002 | Huber et al. |
| 2003/0124887 A1 * | 7/2003 | Bloomfield et al. ........... 439/92 |
| 2004/0066643 A1 | 4/2004 | Beihoff et al. |

FOREIGN PATENT DOCUMENTS
EP   0 291 400   11/1988
EP   1 087 652   3/2001

OTHER PUBLICATIONS
French Search Report dated Mar. 2, 2005.

* cited by examiner

Primary Examiner—Hung S Bui
(74) *Attorney, Agent, or Firm*—Locke Lord Bissell & Liddell

(57) ABSTRACT

The present invention concerns an electronic assembly with a heat sink in particular for a discharge lamp control module for a motor vehicle headlight.

The electronic assembly with heat sink comprises essentially a printed circuit and a housing able to serve for thermal insulation and/or for electrical insulation and which comprises a heat sink. The heat sink is interposed between at least one face of the printed circuit and a face of the housing, the said heat sink extending over a major part of the face of the printed circuit and comprising an adhesive face for securing it to the printed circuit on the one hand and an adhesive face for securing it to the face of the housing on the other hand.

25 Claims, 2 Drawing Sheets

ELECTRONIC ASSEMBLY WITH A HEAT SINK IN PARTICULAR FOR A DISCHARGE LAMP CONTROL MODULE FOR MOTOR VEHICLE HEADLIGHTS

FIELD OF THE INVENTION

The present invention concerns an electronic assembly with a heat sink in particular for a discharge lamp control module for a motor vehicle headlight. In the prior art, printed circuits have already been assembled on metallic substrates. When electronic power circuits are put in operation on the printed circuit, there occurs both a noisy electromagnetic environment and thermal shocks caused by abrupt variations in electrical voltage or electrical current.

BACKGROUND OF THE INVENTION

In a first prior art presented by the present applicant, in particular in the application EP 1.087.652, a description has already been given of an improvement to electronic assemblies with heat sink. In such assemblies, a relatively rigid printed circuit or card is associated, by means of a heat-conducting material, with a metallic piece or sole plate which makes it possible to discharge the thermal energy dissipated on the substrate of the printed circuit. In particular, in this first prior art, the metallic sole plate has a stud for fixing to the printed circuit through a drilling therein so that, when the stud is deformed by means of a tool during assembly, the printed circuit and the sole plate are fixed to each other, on the one hand, and a thermal coupling of the printed circuit and metallic sole plate by means of the heat-conducting and electrically insulating material is effected, on the other hand.

Unfortunately, this first prior art introduces several problems. In particular, between the printed circuit and the aluminium radiator, a material with two components, one of which is based on silicone with a filler whilst the other is a screen based on glass fibres, is compressed in a controlled or mastered fashion. The function of the first material is to produce heat conduction. The function of the second material is to effect electrical insulation. More particularly, the dual-component material fills the empty space between the metallic sole plate and the printed circuit.

The electrical earthing between the metallic sole plate and a provided conductive part of the printed circuit is provided by riveting the printed circuit to the sole plate by means of the aforementioned stud.

As a result the use of such a dual-component material is complex and has a high cost during mass production. In a second prior art, the electrical insulation function is provided by raising the printed circuit with respect to its radiator, by a sufficient value to guarantee electrical insulation or thermal conduction through the layer of glass fibres. The hot zones of the printed circuit receive a thin single-phase multilayer adhesive on the bottom face. A layer of copper is provided for thermal conduction whilst a layer of the "Kapton" type is provided for electrical insulation. Contact between the printed circuit on the one hand and the radiator on the other hand is provided solely in the hot zone by a thermal paste which is not electrically insulating and which fills the empty space between the radiator and the printed circuit. This paste makes it possible in particular to achieve a compensation for the geometric tolerances of the mechanical parts. The positioning of the printed circuit is provided by the centring studs on the radiator. Its holding and fixing are provided by the crushing of elastomeric pads fixed in the cover of the module. The cover makes it possible to execute a support for the printed circuit on the face of the housing. The electrical earthing is provided by tin balls which are crushed on a conductive part, provided for this purpose, of a printed circuit when the cover of the module is crimped on its body proper.

In a third prior art, the electrical insulation is also provided by a layer of air. However, the hot areas of the printed circuit benefit from thermal dissipation by means of a dual-component material as in the first prior art. The printed circuit is fixed to the radiator by a screw and the solution of electrical earthing is once again executed by means of tin balls.

All these three aforementioned prior arts therefore propose solutions with a high cost. Because of the dissociation of the heat conduction and electrical insulation functions in particular, there are many parts and also many assembly techniques. There are therefore no possible optimisations of the manufacturing process.

Contrary to this, the invention concerns an electronic assembly with a heat sink that comprises essentially a printed circuit and a housing that can serve for the thermal conduction and/or for the electrical insulation and which comprises a complex interface layer.

SUMMARY OF THE INVENTION

According to the present invention, the complex interface layer is interposed between at least one face of the printed circuit and one face of the housing, the complex interface layer extending over a major part of the face of the printed circuit and comprising an adhesive face for its fixing to the printed circuit on the one hand and an adhesive face for its fixing to the face of the housing on the other hand.

According to other aspects of the invention:
the assembly comprises at least one complementary fixing element for fixing the printed circuit to the complex interface layer and to the body of the housing disposed in relation to a conductive area of the printed circuit;
the fixing element cooperates with drillings on the complex interface layer on the one hand and the printed circuit on the other hand;
the fixing element consists of a stud fixed to one face of the bottom of the housing body, like a projection on the bottom of the housing body and formed so as to deform under the action of a tool and thus to fix together the housing body, the complex interface layer and the printed circuit;
the fixing element is in electrical contact with an earthing conductive element on the electrical connection diagram of the printed circuit;
the complex interface layer comprises, from top to bottom, a first adhesive layer that connects the complex interface layer with the major part of one face of the printed circuit;
a layer of electrical insulator;
a second adhesive layer that connects the complex interface layer with a large part of the opposite face of the housing body;
the complex interface layer also comprises a layer of heat-conducting material;
at least one of the layers is both at least electrically insulating and/or heat conducting and/or adhesive;
the top part of the top of the fixing stud is configured as to:
effect electrical earthing contact with the conductive area;
effect mechanical abutment of the printed circuit on the complex layer and on the bottom of the housing;
provide thermal coupling by the elimination of any air space between the printed circuit and the housing thus serving as a heat radiator;

the printed circuit has a relative mechanical rigidity and the mutual configuration of the fixing stud and of the shape of the bottom of the housing results in a permanent abutment force that itself causes a deformation tension in the whole of the printed circuit and applies it against the bottom of the housing body;

the bottom of the housing has a concave shape, and the fixing stud is disposed at the centre of the bottom of the housing (3);

the adhesive used for producing the adhesive layers (5, 6) is preferentially produced by an acrylic mass;

the layer of electrical insulator has a sufficiently low heat resistance to fulfil the function of heat dissipation;

the layer of electrical insulator is made from polyester, polyethylene naphthalate (PEN) or polyimide;

the complex interface layer is sized so that it projects beyond or is at least tangent to at least one edge of the printed circuit;

the dimensions of the complex interface layer are greater than those of the printed circuit, so that the edge of the complex interface layer projects beyond and may be bonded to the thick edge of the printed circuit;

the complex interface layer, which is interposed between one face of the printed circuit and one face of the housing bottom, also comprises a conductive layer, produced by a thin layer of conductive metal, a film made from a conductive polymeric material or a thin conductive grille, the pattern of which is predetermined;

the conductive layer is electrically connected to a reference potential in order to provide protection against electromagnetic interference;

the printed circuit carries at least one integrated power circuit that cooperates with a hole in the printed circuit by means of a brazing element or a conductive adhesive and which has metallisation in the form of a via;

the via is cylindrical in shape overall terminating at its top end in a top head and at its bottom end in a bottom head joined to each other by a cylindrical body which borders the thickness of the drilling;

the assembly comprises a thin layer, which has a tendency, when the heat flux is applied to make a brazing slug or a slug of conductive adhesive melt, to obstruct the drilling so that the thin layer constitutes a plug preventing the flow of molten solder or conductive adhesive;

the thin layer is a lacquer protecting the printed circuit;

the housing comprises a closure cover which comprises at least one flexible arm provided with a support part which comes into close contact with a conductive pad that belongs to the interconnection scheme and that is connected to the electrical earthing circuit on the printed circuit, and the cover and where applicable the housing body are produced from an electrically conductive material and the flexible arm has controlled flexibility that participates in the putting in abutment of the assembly composed of the printed circuit and the complex interface layer on the bottom, such as a concave bottom of the housing.

The invention also concerns a method of manufacturing an electronic module, such as a discharge lamp control module for a motor vehicle headlight, wherein the method includes steps comprising:

the fitting of electrical components, and the laying of the electrical connection pattern on the printed circuit, which is then provided with a drilling, formed in a central area of the printed circuit, a conductive track or area being produced on the top face of the printed circuit, which makes it possible to connect an electrical earthing with the aforementioned connection pattern;

the production of the complex interface layer disposed through its drilling on the bottom of the housing, by making a fixing stud pass through the drilling;

the presentation of the printed circuit over the opening in the housing body, so that the drilling can surround the fixing stud;

the production of a permanent connection, a deformation tool then being introduced through the opening in the housing so that the top of the fixing stud is then deformed over the conductive electrical earthing area on the printed circuit.

Finally, the invention concerns an electronic module, such as a discharge lamp control module for a motor vehicle headlight, wherein the electronic module comprises at least one assembly with a heat sink with a complex interface layer with two adhesive layers.

Other characteristics and advantages of the present invention will be understood more clearly and by means of the description and accompanying figures, amongst which:

DESCRIPTION OF THE PREFERRED EMBODIMENTS

Figure 1:
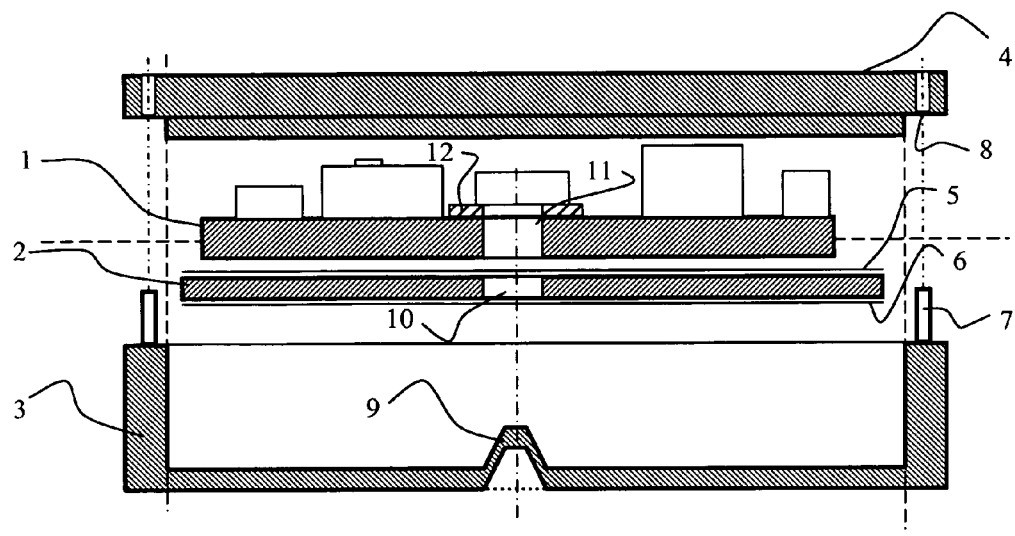
FIG. 1 depicts a view in section of one embodiment of the present invention.

FIG. 1 depicts a view in schematic section of an embodiment of the present invention. A printed circuit 1 comprises a substrate made from synthetic material. The substrate of the printed circuit carries, for example on only one of its faces, several electronic or electrical components comprising in particular electronic power circuits such as power transistors, electronic control circuits for controlling these electronic power components, and passive components such as resistors, capacitors, connectors, etc. The substrate of the printed circuit also carries one or more layers of an electrical connection pattern produced by means of conductive tracks, which make it possible to raise connection pins of each of the components deposited on the substrate to a given electrical potential and/or to provide them with given electric currents.

The thermal dissipations produced by the flow of electrical current produce heating locally that is applied to the substrate and that it is very important to dissipate in order to avoid on the one hand deterioration in the operating performance of the electrical circuit formed by the connection pattern and the components and on the other hand deterioration in the mechanical qualities of the printed circuit proper, which might result in destruction of the service function provided by the assembly.

According to the invention, the printed circuit is intended to be mounted on a part serving in particular as a radiator and support, possibly also in the form of a housing serving as mechanical protection, whilst being interposed relative to this support by means of a complex layer 2, 5, 6, which serves both for heat conduction and electrical insulation of the printed circuit with the radiating support 3.

When the radiating support 3 also serves as mechanical protection, it is formed in the form of a housing and can have in particular a top cover 4 that is intended to be engaged on small columns such as the column 7 which, through drillings, such as the drilling 8, connect together the housing body 3 and its cover 4.

The connection of the printed circuit 1 with the complex interface layer 2, 5, 6 and with the housing body 3 is provided by means of a fixing element 9 that passes through the drillings, respectively 10 and 11, and the complex interface layer on the one hand and the printed circuit 1 on the other hand. According to the invention, the fixing element 9 is disposed in relationship with an area, rather disposed at the centre of the printed circuit 1. It may be multiplied, that is to say there may be several fixing elements like the fixing element 9.

Preferentially, the fixing element 9 consists of a stud fixed to a bottom face of the housing body 3. The fixing stud 9 can consist of a projection on the bottom of the housing body 3. Preferentially, the fixing stud 9 is shaped so as, when a deformation tool (not shown in FIG. 1) deforms it, to flatten and thus to fix together the housing body 3, the complex interface layer 2, 5, 6 and the printed circuit 1.

In a preferred embodiment, the complex interface layer 2, 5, 6 is a composite element that comprises at least, from top to bottom:

a first adhesive layer 5 that connects the complex interface layer with the major part of one face of the printed circuit 1;

a layer of an electrical insulator 2;

a second adhesive layer 6 that connects the complex interface layer with a large part of the opposite face of the housing body 3, the layer being able to fulfil several of the above functions by itself.

In the present invention, such a complex interface layer will indifferently be referred to as a "heat sink".

In one example of a method of manufacturing an electronic module, such as a discharge lamp control module for a motor vehicle headlight, the fitting of the electrical components and the placing of the electrical connection pattern are executed on the printed circuit 1, which is then provided with a drilling 11, preferably formed in a central area of the printed circuit 1. A conductive area or track 12 is produced on the top face of the printed circuit 1, which makes it possible to connect electrical earthing with the aforementioned connection pattern.

The complex interface layer is then produced so as to exhibit the structure described above, and is disposed through its aforementioned drilling 10 on the bottom of the housing, by making the fixing stud 9 pass through the drilling 10.

The printed circuit 1 is then in its turn presented above the opening in the casing body 3, so that the piercing 11 can surround the fixing stud 9.

In order to achieve a permanent connection, a deformation tool is then introduced through the opening visible at the top part of the housing 3. The top of the fixing stud 9 is then deformed over the earthing conductive area 12 on the printed circuit 1. The effect of this deformation of the upper part of the top of the fixing stud 9 is then to:

make the earthing electrical contact with the conductive area 12;

effect a mechanical abutment of the printed circuit 1 on the complex interface layer and on the bottom of the housing 3;

provide thermal coupling by the elimination of any air space between the printed circuit 1 and the housing 3 thus serving as a heat radiator.

The latter thermal coupling effect is particularly ensured when the printed circuit 1 has a relative mechanical rigidity. This is because the deformation of the fixing stud 9 applies a permanent abutment force that itself causes a deformation tension in the whole of the printed circuit and applies it against the bottom of the housing body 3.

The adhesive used for producing the adhesive layers respectively 5 and 6 is preferentially implemented by an acrylic mass. The heat conduction layer 2 consists of a material that is also an electrical insulator that is preferentially a polyester. This is because there exists a class of polyester that has sufficiently low thermal resistance to fulfil the thermal dissipation function.

Preferentially, the complex interface layer 2, 5, 6 is sized so that, after the operation of deformation of the fixing stud 9, it projects beyond or is at least tangent to the edge of the printed circuit 1.

The top contact face of the housing bottom 9 with the contact layer 2, 5, 6 is preferentially flat, so that the contact can bear on the largest surface possible. However, in other applications, the shape of the top contact surface of the housing bottom 9 can take complex shapes, in particular with dishes, at the bottom of which there will be no contact. Such a conformation is not indicated in the drawing.

Figure 2:
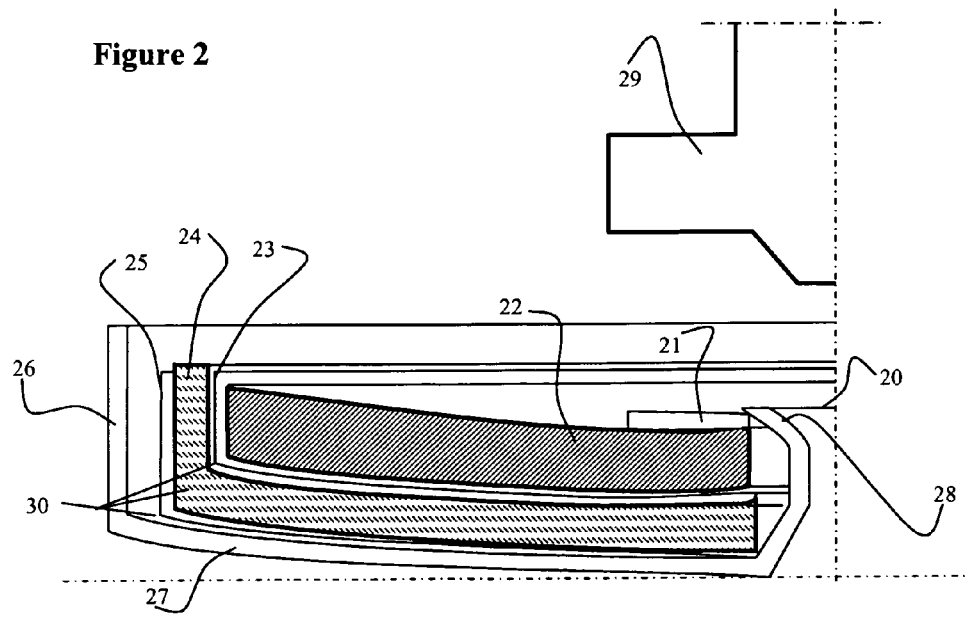
FIG. 2 depicts a half view in section of another embodiment of the present invention.

FIG. 2 depicts another embodiment in a half view in section. Only the housing body is depicted, which has a vertical flank 26 connected to a concave bottom 27. The centre of the concave bottom 27 has a fixing stud 20 which takes the form of a hollow-shaped column.

The complex interface layer comprises a first adhesive layer 25, an insulating layer 24 and a second adhesive layer 23. It is placed between the concave bottom 27 and a bottom face of the printed circuit 22. In this particular embodiment, a second arrangement is taken in accordance with the invention according to which the dimensions of the complex interface layer are greater than those of the printed circuit 22, so that the edge of the complex interface layer projects beyond or can be mounted on the thick edge of the printed circuit 22. The printed circuit 22 has according to the invention a central drilling which corresponds to the central drilling in the complex interface layer and an earthing track 21. The column serving as a fixing stud 20 can then be subjected to the crushing of a deformation tool 29 for the head to engage in the hollow part of the column 20 so that the top of the column 20 broadens in a broadened truncated cone 28 at the top which comes into abutment on the top of the face of the earthing track 21 and which deforms the assembly along the concave bottom 27. In this way there is provided:

a permanent deformation which allows the abutment of all the surfaces on one another;

correct thermal coupling.

Figure 3:
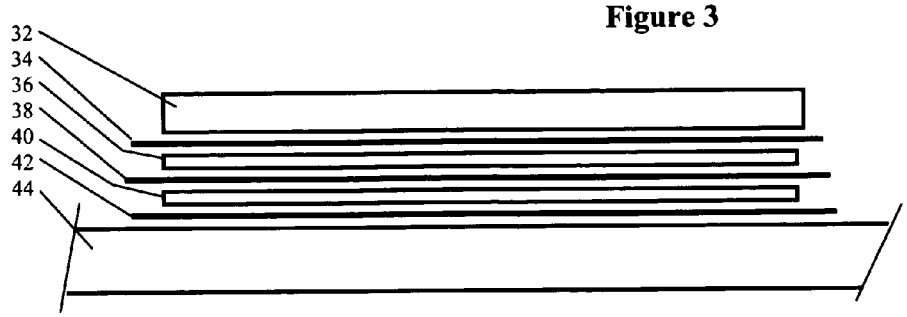
FIG. 3 depicts a schematic view in section of another embodiment of the present invention.

FIG. 3 depicts a schematic view in section of another embodiment of the present invention. According to this embodiment, the complex interface layer that is interposed between a face of the printed circuit and a face of the housing bottom also comprises an electrically conductive layer. Such a conductive layer can be implemented by a thin film of a conductive metal, a film of a conductive polymer material, or a thin conductive grille whose pattern is predetermined.

FIG. 3 depicts the succession of the assembly that is, from top to bottom, composed of:

the printed circuit proper 32;

an adhesive film 34;

a heat-conducting layer 36;

an adhesive film 38;

a layer consisting of a heat-conducting and electrically insulating material 40;

an adhesive film 42;

the contact face of the housing bottom 44, one of the layers 32, 34, 36, 38, 40 and 42 being able to fulfil several of the above functions by itself, that is to say be both at least electrically insulating and/or heat conducting and/or adhesive.

Figure 4:
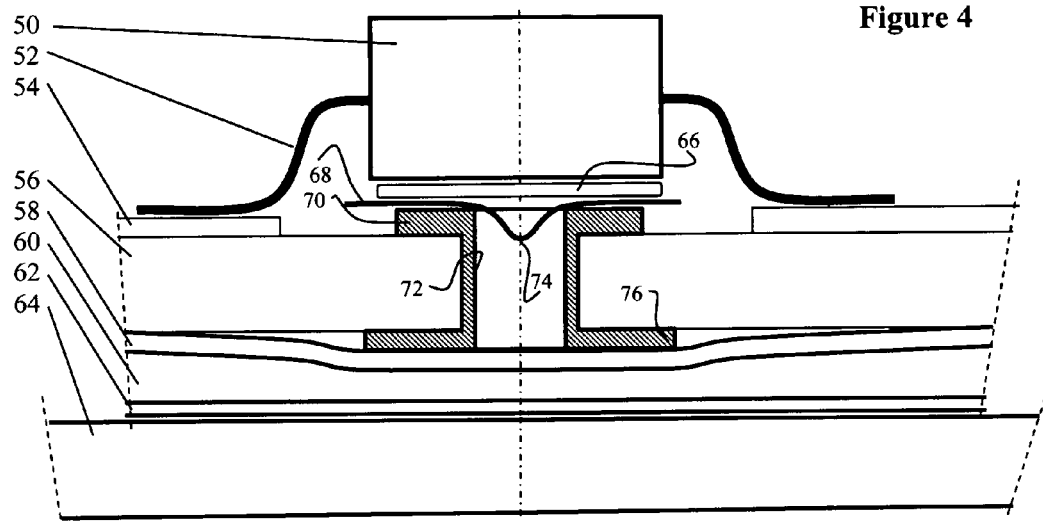
FIG. 4 depicts a view in partial section of another embodiment of the present invention.

FIG. 4 depicts another embodiment of the invention in the form of a half view in schematic section.

An integrated power circuit 50 has two rows of terminals formed by the folding of a grille that is intended to come into contact with soldering pads on the electrical connection pattern deposited on the face of the printed circuit 56. There is shown a lug 52 for connecting the integrated power circuit 50 with a conductive pad 54 of the aforementioned electrical connection pattern. In order to improve the thermal transfer of the heat produced by the integrated power circuit 50, a hole is disposed in line with the housing of the integrated circuit 50 which passes entirely through the printed circuit 56, which has a metallisation in the form of a via. Such a via is cylindrical in shape overall, terminating at its top end in a top head 70 and at its bottom end in a bottom head 76. The top 70 and bottom 76 heads are joined to each other by a cylindrical body 72 that borders the thickness of the drilling. The result is two characteristics that are difficult to implement:

first of all, the top 70 and bottom 76 heads constitute thicknesses which have a tendency, particularly for the low head 76, to deform the complex interface layer, composed of an adhesive film 58, the electrically insulating and heat-conducting layer 65 and the second adhesive film 62 which comes into contact with the bottom of the housing 64; there is therefore no longer good thermal coupling between the face of the printed circuit and the interface layer precisely in the hot thermal area;

next, the thermal via is hollow in its cylindrical thickness 72; however, in order to achieve good thermal contact and mechanical fixing of the housing of the integrated circuit 50 on the printed circuit proper, it is known how to deposit a brazing slug 66 on the thermal via 70, 72 and 76 so that, by applying a soldering thermal flux, the solder 66 can melt and solder the bottom of the integrated circuit housing 50 to the surface of the via. However, in this type of design, the solder has a tendency to flow inside the cylindrical via 72 so that a fluid from a burning material could come into contact, in particular, with the first adhesive film 65, and then where applicable pierce the insulating layer 62.

In order to remedy this drawback, the invention proposes to deposit a thermally degradable film or thin layer 68 which has a tendency, when the heat flux is applied to make the solder 66 melt, to obstruct the piercing 72 in the via so that the protective lacquer of the printed circuit constitutes a plug preventing the flow of molten solder. However, the lacquer used is volatilised on the surface of the printed circuit 56 so that the contact of the molten solder 66 with the surface of the printed circuit 56 is correct. In a variant, instead of using a solder 66, it is possible to use a conductive adhesive.

Figure 5:
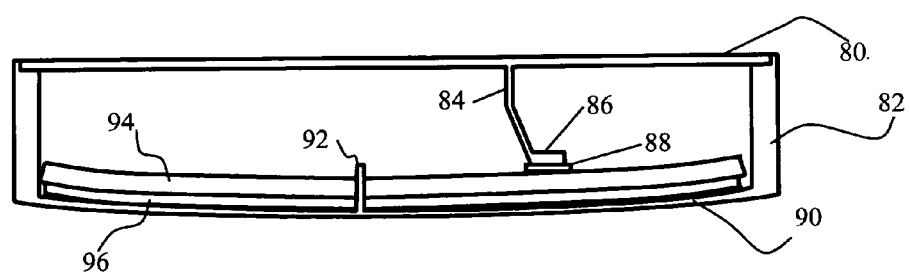
FIG. 5 depicts a view in section of another embodiment of the present invention.

FIG. 5 depicts another embodiment of the invention in the form of a half view in schematic section.

The assembly of this embodiment of the invention is formed in a closed housing comprising a cover 80 and a housing body comprising radical lateral flanks 82 and a horizontal bottom 90 concave in shape. The cover 80 can be connected to the body 82, 90 in a sealed fashion by any known securing means. The fixing means 92 passes through the complex interface layer 96 as well as the printed circuit 94, on which particular electrical components have not been depicted. It should be noted on this occasion that the printed circuit is generally provided with at least one connector which must remain accessible outside the housing through an opening therein, in general on a vertical edge 82, protected where necessary by a flap, not shown.

According to the invention, the cover 80 of the housing comprises at least one flexible arm 84 provided with a support part 86 which comes into close contact with a conductive pad 88 and belongs to the connection which is connected to the electrical earthing circuit on the printed circuit 94. In this case the cover and where applicable the housing body are produced by an electrically conductive material and the flexible arm has controlled flexibility that participates in the putting into abutment of the assembly composed on printed circuit 94 and the complex interface layer 96 on the concave bottom 90 of the housing.

What is claimed is:

1. An assembly, comprising:
    a printed circuit;
    an interface layer coupled to the printed circuit via a first adhesive face of the interface layer;
    an electrically conductive housing coupled to at least a second adhesive face of the interface layer; and
    at least one fixing element attached to an inner surface of the housing, the at least one fixing element passing through at least one hole in the interface layer and at least one hole in the printed circuit and fixing the printed circuit and the interface layer to the inner surface of the housing.

2. The assembly according to claim 1, the fixing member further being electrically coupled to a conductive area on the printed circuit.

3. The assembly according to claim 1, wherein the fixing element consists of a stud secured to a bottom face of the housing, the stud deforming under the action of a tool to fix together the housing body, the complex interface layer and the printed circuit.

4. The assembly according to claim 1, wherein a conductive area on the printed circuit serves as an electrical ground.

5. The assembly according to claim 4, wherein the upper part of the fixing element grounds the conductive area, effects mechanical abutment of the printed circuit to the interface layer and to the housing, and provides thermal coupling by eliminating any air space between the printed circuit and the housing.

6. The assembly according to claim 5, wherein the printed circuit has relative mechanical rigidity, so that the mutual configuration of the fixing element and of the shape of the bottom of the housing results in a permanent abutment force that causes a deformation tension in the printed circuit that presses it against the bottom of the housing body.

7. The assembly according to claim 6, wherein the bottom of the housing has a concave shape, and further wherein the fixing element is disposed at the centre of the bottom of the housing.

8. The assembly according to claim 7, wherein the dimensions of the interface layer are greater than those of the printed circuit so that the edge of the interface layer projects beyond and may be bonded to the thick edge of the printed circuit.

9. The assembly according to claim 1, wherein the printed circuit carries at least one integrated power circuit that cooperates with a hole in the printed circuit by means of a brazing element of a conductive adhesive and which has a metallisation in the form of a via.

10. The assembly according to claim 9, wherein the via is cylindrical in shape overall, terminating at its upper end in a top head and at its lower end in a bottom head joined to each other by a cylindrical body which borders the thickness of the hole.

11. The assembly according to claim 10, comprising a thin layer which, when the heat flux is applied to make a brazing slug or a slug of conductive adhesive melt, obstructs the hole so that the thin layer becomes a plug preventing the flow of the molten solder or conductive adhesive.

12. The assembly according to claim 11, wherein the thin layer is a lacquer producing the protection of the printed circuit.

13. The assembly according to claim 1, wherein the interface layer further comprises a conductive layer produced by a thin layer of a conductive metal, a film made from a conductive polymer material, or a thin conductive grille whose pattern is predetermined.

14. The assembly according to claim 13, wherein the conductive layer is electrically coupled to a reference potential in order to provide protection against electromagnetic interference.

15. The assembly according to claim 1, wherein the interface layer further comprises a layer of an electrical insulator between the first adhesive face and the second adhesive face.

16. The assembly according to claim 15, wherein the interface layer also comprises a layer of heat-conducting material.

17. The assembly according to claim 15, wherein at least one of the layers is both at least electrically insulating and/or heat conducting and/or adhesive.

18. The assembly according to claim 15, wherein the adhesive used for producing the first and second adhesive layers is preferably produced from an acrylic mass.

19. The assembly according to claim 15, wherein the layer of electrical insulator has a sufficiently low thermal resistance to fulfill the function of heat dissipation.

20. The assembly according to claim 19, wherein the layer of electrical insulator is a polyester, made from polyethylene naphthalate or polyimide.

21. The assembly according to claim 15, wherein the interface layer is sized so that it projects beyond or is at least tangent to at least one edge of the printed circuit.

22. The assembly according to claim 1, wherein the housing further comprises a closure cover that includes at least one flexible arm provided with an abutment part which contacts a conductive pad which belongs to the interconnection pattern, and which is further coupled to the electrical ground on the printed circuit, and in that the cover, and where applicable the housing body, are produced from an electrically conductive material and the flexible arm has controlled flexibility that presses the assembly composed of the printed circuit and the complex interface layer into abutment with the concave bottom of the housing.

23. A discharge lamp control module for a motor vehicle headlight, comprising at least the assembly set forth in claim 1.

24. The assembly according to claim 1, wherein the housing is also thermally conductive.

25. A method of manufacturing an electronic module, comprising:
fitting electrical components and laying an electrical connection pattern to form a printed circuit, which is then provided with a first hole formed in a central area of the printed circuit and a conductive area being formed on the top face of the printed circuit, the conductive area further being coupled to the electrical ground of the electrical connection pattern;
constructing an interface layer including at least two adhesive faces and a second hole, the interface layer being placed on the bottom of a housing, so that a fixing stud affixed to an interior surface of the housing passes through the second hole, and at least one of the adhesive faces comes into contact with the housing;
presenting the printed circuit over the housing so that the fixing stud passes through the first hole; and
deforming the top of the fixing stud so that it comes into contact with the conductive area.

* * * * *